(12) United States Patent
Chang

(10) Patent No.: US 10,636,718 B2
(45) Date of Patent: Apr. 28, 2020

(54) INORGANIC PACKAGING MODULE HAVING A CHIP ENCAPSULATED THEREIN

(71) Applicant: Sheng Hsiang Chang, Fuishan (TW)

(72) Inventor: Sheng Hsiang Chang, Fuishan (TW)

(73) Assignee: Chang Sheng Hsiang Chang, Fuishan (TW)

( * ) Notice: Subject to any disclaimer, the term of this patent is extended or adjusted under 35 U.S.C. 154(b) by 0 days.

(21) Appl. No.: 16/137,868

(22) Filed: Sep. 21, 2018

(65) Prior Publication Data

US 2019/0088567 A1 Mar. 21, 2019

(30) Foreign Application Priority Data

Sep. 21, 2017 (TW) .............................. 106132332 A

(51) Int. Cl.
| | |
|---|---|
| *H01L 23/31* | (2006.01) |
| *H01L 23/13* | (2006.01) |
| *H01L 23/498* | (2006.01) |
| *H01L 21/56* | (2006.01) |
| *H01L 21/50* | (2006.01) |
| *H01L 23/055* | (2006.01) |
| *H01L 23/10* | (2006.01) |

(52) U.S. Cl.
CPC .......... *H01L 23/3128* (2013.01); *H01L 21/50* (2013.01); *H01L 21/563* (2013.01); *H01L 23/055* (2013.01); *H01L 23/10* (2013.01); *H01L 23/13* (2013.01); *H01L 23/3114* (2013.01); *H01L 23/49827* (2013.01); *H01L 23/49866* (2013.01); *H01L 2224/16225* (2013.01)

(58) Field of Classification Search
CPC ....... H01L 23/055; H01L 23/10; H01L 23/13; H01L 23/3114; H01L 23/3128; H01L 23/49827; H01L 23/49866
See application file for complete search history.

(56) References Cited

U.S. PATENT DOCUMENTS

| | | | | |
|---|---|---|---|---|
| 4,801,998 A | * | 1/1989 | Okuaki ................. | G11C 16/18 257/681 |
| 5,311,402 A | * | 5/1994 | Kobayashi ............. | H01L 21/52 174/17.05 |
| 5,616,520 A | * | 4/1997 | Nishiuma ............... | H01L 23/10 228/180.22 |
| 5,786,548 A | * | 7/1998 | Fanucchi ................ | H01L 21/50 174/17 CT |
| 2010/0104887 A1 | * | 4/2010 | Yamamoto ............. | H01L 23/04 428/576 |
| 2017/0279019 A1 | * | 9/2017 | Ueda ....................... | H01L 33/62 |

* cited by examiner

*Primary Examiner* — Peniel M Gumedzoe

(74) *Attorney, Agent, or Firm* — Wang Law Firm, Inc.

(57) ABSTRACT

A packaging module includes a substrate, a chip firmly mounted on the substrate, a frame firmly connected to the substrate via a gold-to-gold bonding and a cover firmly connected to the frame via the same gold-to-gold bonding. With the inorganic bonding structure, the packaging module is able to endure high temperature and high pressure without the worry of bonding agent being damaged by environmental condition change.

16 Claims, 3 Drawing Sheets

INORGANIC PACKAGING MODULE HAVING A CHIP ENCAPSULATED THEREIN

CROSS REFERENCE

This application is based upon and claims priority to Taiwanese Patent Application No. 106132332, filed on Sep. 21, 2017, the entire contents of which are incorporated herein by reference.

BACKGROUND OF THE INVENTION

1. Field of the Invention

The preferred embodiment(s) as well as examples listed in the description is related to a packaging module and, more particularly to an inorganic packaging module having a chip encapsulated thereon.

2. Description of the Related Art

Ever since the introduction of chip used in the electronic industry emerged into the market, researchers have studied numerous information trying to find a durable yet low-cost material to withstand the heat generated during the operation of the chip(s). In the beginning, Polyphthalamide (PPA) is adopted as a primary material for packaging. As technology advances, PPA is no longer the favorite in the industry and is replaced with Epoxy Molding Compound (EMC), which is used for making the lead-frame for its high heat durability and applied in electronic devices that require 1-3 watts. Again, due to the limitations set forth within the material itself, packaging module using EMC is hard to march to higher power output devices.

Especially, when the packaging module involves ultraviolet light, the material used, either it is the PPA or the EMC, will become crispy and fragile. It is because when the conventional packaging module is exposed under ultraviolet light for a long period of time, there will be a fundamental change to the nature of the material, which leads to the consequence that the packaging module has cracks everywhere and is no longer air-tight and water-proof.

After the discussion of the disadvantages while adopting PPA or EMC for parts of the entire packaging module, there is also another disadvantages of the packaging module. It is known from the packaging technology that a general packaging module includes a substrate, a lead-frame, i.e., dam and a cover. The PPA or EMC often is adopted for making the lead-frame and there are numerous choices or the substrate depending on the application and purpose of making the packaging module. Usually, the substrate may be made of an organic material, for example, plastic, i.e., PCB or an inorganic material, for example, ceramic. Normally, when the substrate and the lead-frame is to be connected to one another, an organic connection agent, e.g., frit, is used to securely connect the substrate and the lead-frame. Again, the same frit is applied to bond the lead-frame and the cover. As this connection technology has been used in the field for many year and the packaging industry has found nothing wrong with the final result, the entire packaging process is still then adopted in many different products.

However, as discussed before, when the organic material is exposed in an environment full of ultraviolet light, the organic material becomes hard and crispy, which leads to the easy separation between the substrate and the lead-frame or between the lead-frame and the cover. After a long period of time exposing under ultraviolet light, the bonding or connection between the substrate and the lead-frame or between the lead-frame and the cover fails and the electronic element packaged inside the packaging module will then be damaged by moist in the air.

Still, while ultraviolet light is required in, such as, medical industry or disinfection application to water or air, around 60%~70% of light efficiency becomes heat during transformation. Under the deep ultraviolet light industry, only 10% of the efficiency is transformed into the required light and the remainder of the ultraviolet light is transformed into heat. With the increasing requirements of ultraviolet light in the field, light tubes capable of emitting ultraviolet light have been largely employed to fulfill the needs in, such as, the medical industry or disinfection application to air or water.

Due to the lifespan limitation of light tubes, light emitting diodes (LEDs) having greater light efficiency and less heat transformation percentage during the generation of ultraviolet light than light tubes are becoming the favorite choice for the manufacturers. Currently, the commercially available LEDs are able to output 30 mW. The traditional low temperature co-fired ceramic (LTCC) or high temperature co-fired ceramic (LTCC) having a heat conduction rate of 2~25 W/mK are able to cope with the heat generated by the LEDs, that is, if ceramic is adopted for making the substrate. However, when the manufacturers aim at higher LED output, the lead-frame or the cover currently adopted are no longer suitable to be compatible for such a high output LEDs, besides there are also the potential problems created by the hardening and crisp of the frit used to combine the substrate and the lead-frame and the lead-frame and the cover.

Either due to the available space limitation or design choice, there are two primary categories for mounting a chip onto a substrate, i.e., flip chip and wire bond. Processing a flip chip is similar to conventional IC fabrication, with a few additional steps. Near the end of the manufacturing process, the attachment pads are metalized to make them more receptive to solder. This typically consists of several treatments. A small dot of solder is then deposited on each metalized pad. The chips are then cut out of the wafer as normal.

To attach the flip chip into a circuit, the chip is inverted to bring the solder dots down onto connectors on the underlying electronics or circuit board. The solder is then re-melted to produce an electrical connection, typically using a Thermosonic bonding or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system. The underfill distributes the thermal expansion mismatch between the chip and the board, preventing stress concentration in the solder joints which would lead to premature failure.

In 2008, a study shows by adding a tape-and-reel process into the assembly methodology, placement at high speed is possible, achieving a 99.90% pick rate and a placement rate of 21,000 cph (components per hour), using standard PCB assembly equipment. The resulting completed flip chip assembly is much smaller than a traditional carrier-based system; the chip sits directly on the circuit board, and is much smaller than the carrier both in area and height. The short wires greatly reduce inductance, allowing higher-speed signals, and also conduct heat better. However, the flip chip manufacturing process has its disadvantages.

Flip chips have several disadvantages. The lack of a carrier means they are not suitable for easy replacement, or manual installation. They also require very flat mounting surfaces, which is not always easy to arrange, or sometimes difficult to maintain as the boards heat and cool. Also, the short connections are very stiff, so the thermal expansion of the chip must be matched to the supporting board or the connections may crack. The underfill material acts as an intermediate between the difference in CTE of the chip and board.

Another common methodology used to mount the chip onto the substrate is wire bonding. Much work has been done to characterize various metal systems, review critical manufacturing parameters, and identify typical reliability issues that occur in wire bonding. When it comes to material selection, the application and use environment will dictate the metal system. Often the electrical properties, mechanical properties, and even cost can play a role. For example, a high current device for a space application might require a large diameter aluminum wire bond in a hermetically sealed ceramic package. If cost is big constraint then avoiding gold wire bonds may be a necessity. Some recent work has been done to look at copper wire bonds in automotive applications. This is only a small sampling, as there is a vast body of work reviewing and testing what material systems work best in different applications.

From a manufacturing perspective, the bonding parameters play a critical role in bond formation and bond quality. Parameters such bond force, ultrasonic energy, temperature, and loop geometry, to name a few, can have a significant effect on bond quality. There are various wire bonding techniques (thermosonic bonding, ultrasonic bonding, thermocompression bonding) and types of wire bonds (ball bonding, wedge bonding) that affect susceptibility to manufacturing defects and reliability issues. Certain materials and wire diameters are more practical for fine pitch or complex layouts. The bond pad also plays an important role as the metallization and barrier layer(s) stacked-up will impact the bond formation.

Typical failure modes that result from poor bond quality and manufacturing defects include: fracture at the ball bond neck, heel cracking (wedge bonds), pad liftoff, pad peel, over-compression, and improper intermetallic formation. A combination of wire bond pull/shear testing, nondestructive testing, and destructive physical analysis (DPA) maybe used to screen manufacturing and quality issues.

While wire bond manufacturing tends to focus on bond quality, it often does not account for wear-out mechanisms related to wire bond reliability. In this case, an understanding of the application and use environment can help prevent reliability issues. Common examples of environments that lead to wire bond failures include elevated temperatures, elevated temperature and humidity, and temperature cycling.

Under elevated temperatures, excessive intermetallics (IMC) growth can create brittle points of fracture. Lots of work that has been done to characterize the intermetallic formation and aging for various metal systems. This not a problem in metal systems where the wire bond and bond pad are the same material such as Al—Al. This does become a concern in dissimilar metal systems. One of the most well-known examples is the brittle intermetallics formed in gold-aluminum IMCs such as purple plague. Additionally, diffusion related issues, such as Kirkendall voiding and Horsting voiding, can also lead to wire bond failures.

Under elevated temperature and humidity environments, corrosion can be a concern. This is most common in Au—Al metal systems and is driven by galvanic corrosion. The presence of halides such as chlorine can accelerate this behavior. This Au—Al corrosion is often characterized with Peck's law for temperature and humidity. This is not as common is other metal systems.

Under temperature cycling, thermo-mechanical stress is generated in the wire bond as a result of coefficient of thermal expansion (CTE) mismatch between the epoxy molding compound (EMC), the leadframe, the die, the die adhesive, and the wire bond. This leads to low cycle fatigue due to shear or tensile stresses in the wire bond. Various fatigue models have been used to predict the fatigue life of wire bonds under such conditions.

Proper understanding of the use environment and metal systems are often the most important factors for increasing wire bond reliability. Giving the situations in relation to both the flip chip and wire bonding, material choice, environmental conditions, manufacturing parameters, etc., are all crucial to the finished product. For example, the temperature for the solder balls, the gold wires and other factors are very difficult to control and easily influenced by environment.

In order to prevent all the difficulties in the manufacturing process, it is an objective of the application to provide a packaging module having a chip encapsulated therein. Using a complete inorganic packaging material to encapsulate the chip allows the manufacturing process to be irrelevant to the difficulties so generated by using organic packaging material, such as epoxy resin, e.g., frit or other organic compound.

SUMMARY OF THE INVENTION

The primary objective of the preferred embodiment of the present invention is to provide a packaging module having a substrate, a chip securely mounted on and electrically connected to the substrate, a frame securely mounted on top of the substrate to enclose the chip inside a space defined by the substrate and the frame, a first Ni layer and a first Au layer formed between the substrate and the frame to securely connect the frame to the substrate and a cover firmly mounted on top of the frame to sealingly encapsulate the chip inside the space.

Another objective of the preferred embodiment of the present invention is that a second Ni layer and a second Au layer are formed between the frame and the cover to firmly mount the cover on the frame.

Another objective of the preferred embodiment of the present invention is that the frame is made of a metallic material which is selected from the group containing of Al, Cu, alloy of Al, alloy of Cu, alloy of Au and alloy of Fe—Co—Ni.

Another objective of the preferred embodiment of the present invention is that the substrate further has a first titanium layer and a patterned copper layer sequentially formed and sandwiched between the substrate and the frame, the patterned copper layer is formed on two opposite sides of the substrate and electrically connected to one another.

Another objective of the preferred embodiment of the present invention is that the frame is made of a nonmetallic material selected from the group consisting of AlN, Al2O3, SiN and SiC.

Another objective of the preferred embodiment of the present invention is that the frame further has a second titanium layer and a second patterned copper layer sequentially formed on two opposite sides of the frame to correspond to and connect to the first Ni layer, the first Au layer, the first Titanium layer and the patterned copper layer.

Another objective of the preferred embodiment of the present invention is that the cover is transparent and made of quartz.

Another objective of the preferred embodiment of the present invention is that a third titanium layer and a third Au layer formed between the cover and the frame to sealingly encapsulate the chip inside the space.

Another objective of the preferred embodiment of the present invention is that an Au—Sn alloy pad sandwiched between the frame and the substrate.

Another objective of the preferred embodiment of the present invention is that a second Au—Sn alloy pad sandwiched between the frame and the cover.

DETAILED DESCRIPTION OF THE PREFERRED EMBODIMENT

Figure 1:
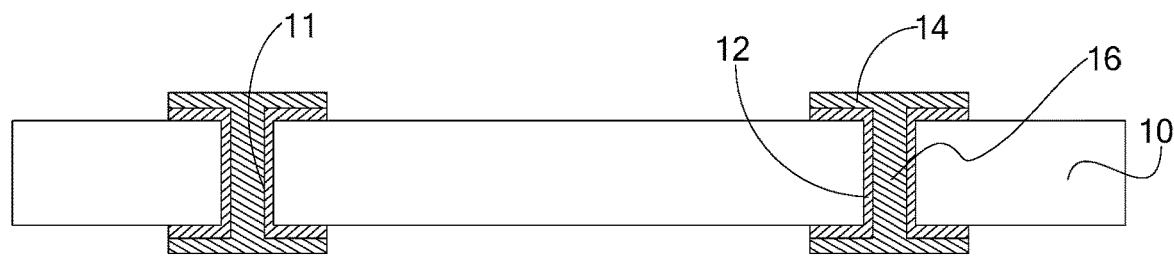
FIG. 1 is a cross sectional view showing the structure of the substrate of the preferred embodiment of the invention.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

The following description describes different preferred embodiments of how the packaging module of the invention is formed and what kind of material(s) is adopted to make the packaging module of the preferred embodiment free from the damages caused by moist in the air.

The preferred embodiment of the present invention provides an inorganic packaging module having at least a chip encapsulated inside the packaging module. As it is suitable for all kinds of chips, the following description adopts LED chip for explanatory purpose. The packaging module includes a substrate carrying thereon a chip, a frame integrally formed on top of the substrate and surrounding the chip and a transparent cover on top of the frame to enclose the chip inside the packaging module. Preferably, the cover is made of quartz. It is to be noted that the cover is securely connected to the frame using inorganic metal as a connection agent. As the connection between the substrate and the frame and between the frame and the cover are both using inorganic metal as a connection agent and because the metal is selected from the same group, the coefficient of thermal expansion (CTE) at the interface between the substrate and the frame as well as the interface between the frame and the cover is well compatible during expansion due to heat and contraction resulting from cold. The finished surface mount device (SMD) has excellent heat conduction and great effect preventing moist from seeping into the packaging module to damage the chip inside the packaging module.

Because each element in this embodiment has numerous processing methods and each method is able to fully achieve the desired purpose of the invention, the following description will be describing different kinds of the substrate and of the frame and then a description about the combination between the substrate and the frame is provided. Later on, a description about the cover and the combination between the cover and the frame is offered.

Figure 2:
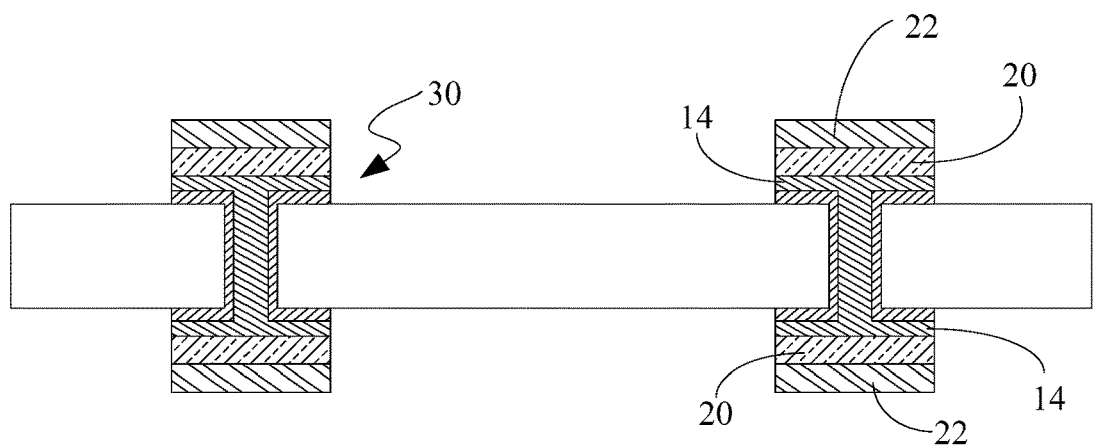
FIG. 2 is still a cross sectional view showing that multiple islands are formed on at least one side of the substrate.

With reference to FIGS. 1 and 2, a substrate 10 made of, such as, ceramic is provided. At least a through hole 11 having a trapezoidal shape is defined through the substrate 10 and filled with a conductive material, such as, copper (Cu). The through hole 11 defined by, preferably, laser, and having the trapezoidal shape is because when laser is employed, as depth goes deeper into the substrate 10, energy of the laser decreases, which leads to the result that the size of the initial stage forming the opening in the substrate 10 is larger than that of the final stage just before the through hole is completed. Later on, a titanium (Ti) layer 12 having a thickness range between 0.01 μm~10 μm is formed on all faces of the substrate 10 and including side faces surrounding the through hole 11. That is, side walls, top and bottom side walls of the through hole 11 are all covered with a layer of titanium, preferably via sputtering. After the titanium layer 12 is formed around the through hole 11, a patterned copper layer 14 of thickness between 0.01 μm~700 μm is formed on top and bottom of the titanium layer 12 and the through hole 11 is filled with copper as well to form a copper bar 16 to electrically connect to the top copper layer and the bottom patterned copper layer 14.

With reference to FIG. 2, it is noted that in order to prevent the patterned copper layer 14 from any undesired reaction with other metal layers, a nickel (Ni) layer 20 having a thickness ranging from 0 μm~10 μm is formed via, for example, plating, on the patterned copper layer 14. Depending on design choices, the nickel layer 20 is optionally formed on top of the patterned copper layer 14 and which is why the thickness of the nickel layer 20 starts from 0 μm. An Au layer 22 is then formed on top of the nickel layer 20 for connection via, for example, plating and has a thickness ranging from 0.05 μm~20 μm. Therefore, it is to be noted that from the central core of the structure shown in FIG. 2, a substrate 10 is provided and then a titanium layer 12 is formed. A patterned copper layer 14 together with a copper bar 16 formed inside the through hole of the substrate to electrically connect to the patterned copper layer 14 is formed. After which, a nickel (Ni) layer 20 and an Au layer 22 are sequentially formed. However, the nickel-Au layers may also be replaced with Ni—Ag or compound of nickel-Palladium (pd)-Au. Application of a proper mask and the related well known process, multiple islands 30 are formed on the substrate 10. Each of the islands 30 contains the Ti layer 12, the copper layer 14, the Ni layer 20 and the Au layer 22. Preferably, the islands 30 are formed on two opposite sides of the substrate 10. The islands 30 on one side of the substrate 10 are for connection with a chip (not shown) and the islands 30 on the other side of the substrate 10 are for connection with other electronic devices, such as, a printed circuit board (PCB).

Figure 3:
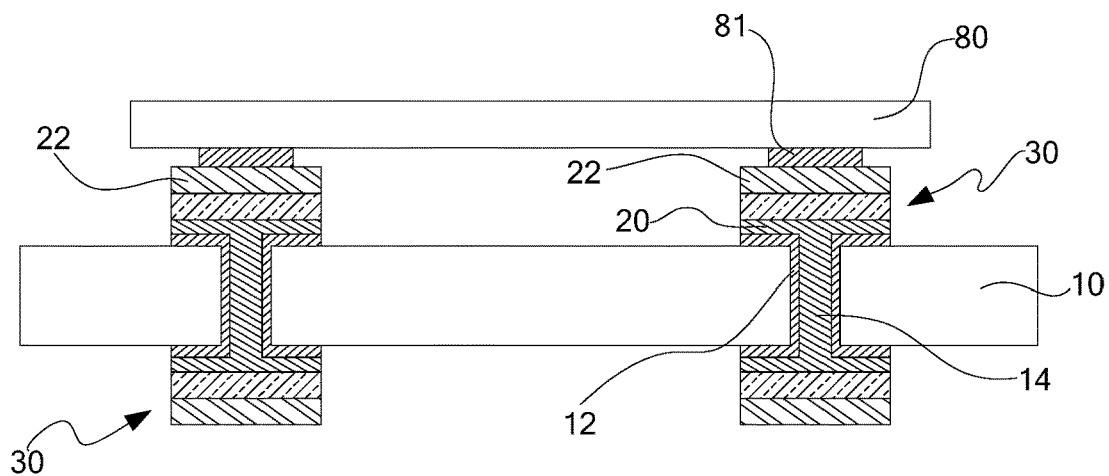
FIG. 3 is a schematic cross sectional view showing that a chip is electrically connected to a pair of islands.
Figure 4:
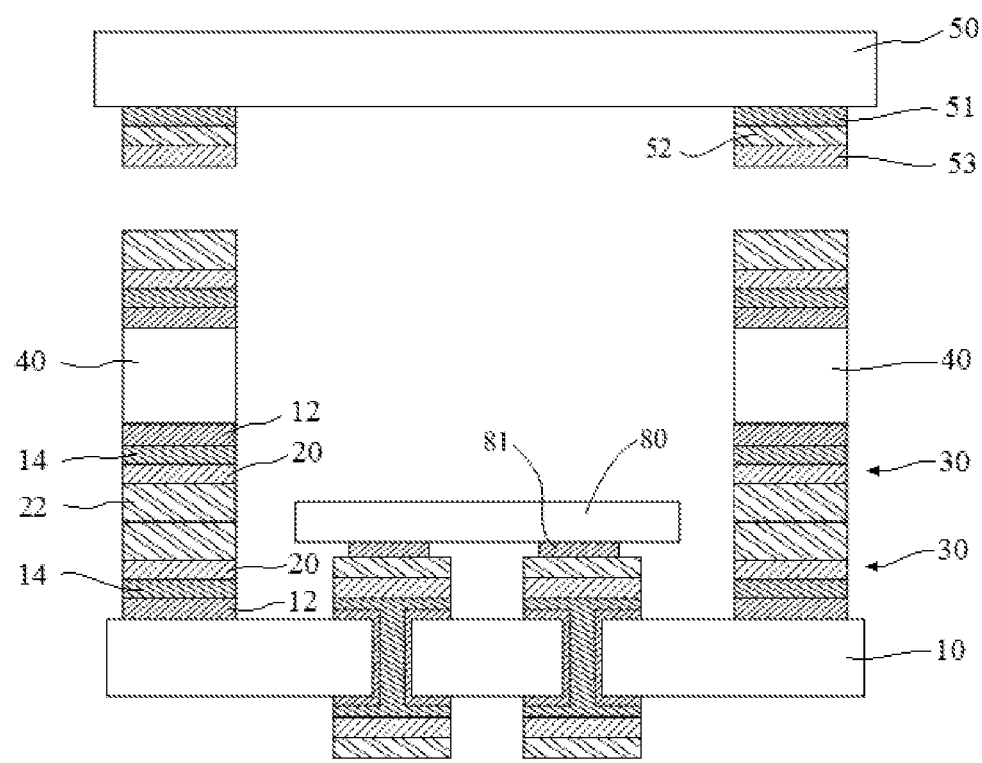
FIG. 4 is a schematic cross sectional view showing that a frame is provide on top of the substrate to surround the chip.

Still, another embodiment to fulfill the desired purpose or effect of the present invention is shown in FIGS. 3 and 4. After the islands 30 are formed on the substrate 10, a chip 80, of any kind, is provided on top of the islands 30 and a pad 81 made of, preferably, alloy of Au—Sn is sandwiched between the islands 30 and the chip 80. The pad 81 functions to securely connect the chip 80 to the substrate 10 via, of course, the islands 30. Also, the use of the pad 81 ensures electrical connection between the chip 81 and the islands 30. After which, a frame 40, as shown in FIG. 4, having two openings in communication with one another is provided on top of the substrate 10 to surround the chip 80. The frame 40 may be made of such as AlN, $Al_2I_3$, $SiN_4$ or SiC and has a titanium layer formed on two opposite sides of the frame 40 and having a thickness between 0.01 μm~10 μm to function as a bonding medium between copper and ceramic. A copper layer having a thickness between 0.01 μm~700 μm is formed on a side face of each of the titanium layer. Again, in order to avoid any unnecessary reaction of the copper with any subsequent metal, a Ni layer is formed on only one side face of the copper layer and has a thickness between 0 μm~10 μm. It is to be noted that the forming of the Ni layer can be neglected or removed depending on design choice for the product and an Au layer having a thickness between 0.05 μm~20 μm is formed on a side face of the Ni layer. It is appreciated from the earlier discussion that the Ti layer, Copper layer, Ni layer and Au layer together form the island 30. As such, no respective reference numeral is provided on the corresponding drawing as they are previously described and shown in the earlier drawings.

After the structures of both the substrate and the frame are introduced, the following description focuses on how the substrate 10 and the frame 40 are combined.

In one preferred embodiment of the present invention, it is to be noted that when each of the substrate 10 and the frame 40 are provided with a layer of metal, a modified Non-Organic Ceramic Heterogeneity (NCH) technology, i.e., Gold-Gold interconnection (GGI) is employed to make use of metal diffusion effect and reach the final result of producing an eutectic compound in the interfaces between the substrate 10 and the frame 40, which results in that the frame 40 and the substrate 10 are firmly connected to each other in a water and air tight manner. That is, the outermost layer, either of the substrate 10 or of the frame 40, is Au, an Au—Au connection (GGI) via the influence of temperature and pressure is formed at an interface between the substrate 10 and the frame 40.

In a different embodiment of the preferred embodiment, shown in FIG. 4, of the present invention, it is noted that the fame 40 may be made of a kind of metal, such as aluminum or copper, an alloy of, such as, aluminum alloy, copper alloy or Fe—Co—Ni alloy. The frame 40 has an island 30 formed on its top side and bottom side. That is, a complete structure of a Ti layer, a copper layer, a Ni layer and an Au layer is formed on two opposite sides of the frame 40 and especially the bottom island 30 of the frame 40 corresponds and connects to one of the islands 30 of the substrate 10. Unlike the previous embodiment where the frame 40 is made of a material selected from the group containing AlN, $Al_2I_3$, $SiN_4$ or SiC, the formation of island 30 on the top and bottom sides thereof may not be necessary. That is, the Ti layer and the Copper layer may be omitted from the manufacture process and the Ni layer and the Au layer are left when the frame 40 is made of a kind of metal listed above. A Nickel (Ni) layer 20 having a thickness ranging from 0.1 μm~3 μm is formed on two opposite sides of the frame 40. Then an Au layer 22 having a thickness of 0.05 μm~20 μm is formed on two opposite sides of the Ni layer 20 to function as a bonding or connection agent. The addition of the Ni layer is to prevent the later-added Au layer from reaction with the material of the frame 40. Still, an Au—Sn alloy pad may be optionally added to the Au layer 22. In the preferred embodiment depicted in FIG. 3 and FIG. 4, when the frame 40 is made of a non-metal material selected from the group consisting of, such as, AlN, $Al_2O_3$, $Si_3N_4$ or SiC, the outermost layer formed thereon is the Au layer 22 and the Au—Sn alloy pad and the outermost layer of each island 30 formed on the substrate 10 is also Au layer and the Au—Sn alloy pad, the GGI interconnection is ready and under properly selected parameters for temperature and pressure, the frame 40 and the substrate 10 are sealingly connected to one another. Also, in the preferred embodiment where the frame 40 is made of a metal selected from the group consisting of, such as, aluminum, copper, aluminum alloy, copper alloy or Fe—Co—Ni alloy, as shown in FIG. 4, the outermost layer is the Au layer and the outermost layer of each island 30 on the substrate 10 is also the Au layer, the GGI interconnection is ready and under the properly selected parameters for temperature and pressure, the frame 30 and the substrate 10 are sealingly connected to one another.

After the frame 40 and the substrate 10 are sealingly connected to one another, a cover 50, preferably transparent, made of quartz is provided on top of the frame 40 to enclose the chip 80 in the space defined by the substrate 10 and the frame 40. Still, in order to securely connect the cover 50 to the frame 40 and to enclose the chip 80 without being influenced by the moisture in the air, a Ti layer 51, an Au layer 52 and an Au—Sn alloy pad 53 are formed on a side face of the cover 50 to correspond and connect to the island 30 when the frame 40 is made of a non-metal material and to the Ni—Au layer and the Au—Sn alloy pad when the frame 40 is made of a metal as previously described. To sum up the connection among the substrate 10, the frame 40 and the cover 50, it is appreciated that there are always a Ni layer and an Au layer regardless of what the frame 40 is made of. That is, when the frame 40 is made of a non-metal material, islands 30 containing the Ti layer, the Copper layer, the Ni layer and the Au layer are formed on the surface of the substrate 10 and on two opposite sides of the frame 40.

However, when the frame 40 is made of a metal from the previously described group, only the Ni layer and the Au layer are necessary.

Figure 5:
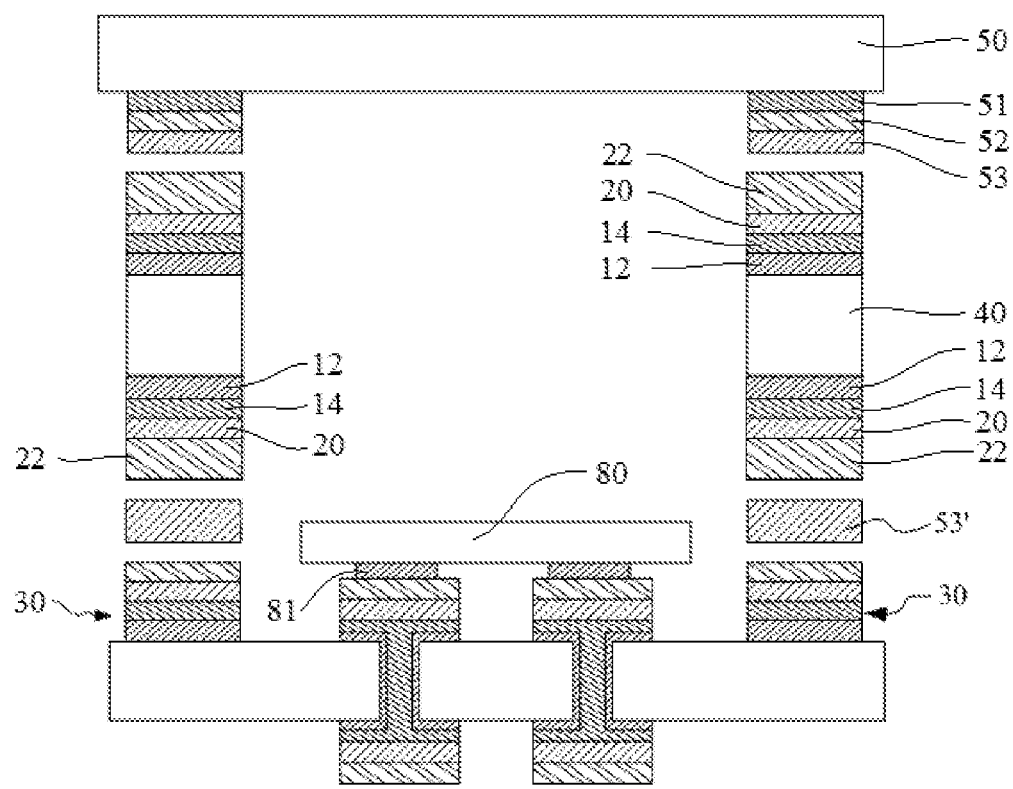
FIG. 5 is a schematic view showing that a cover is mounted on top of the frame to encapsulate the chip.

With reference to FIG. 5, it is noted that in still a different embodiment of the present invention, an Au—Sn alloy pad 53' may be added on top of the islands 30 and sandwiched between the islands 30 and the frame 40.

Although the disclosure has been described in connection with the embodiments shown in the accompanying drawings, a person having ordinary skill in the art can make various modifications to the disclosure based on the above descriptions. Therefore, some details of the embodiment should not be construed to restrict the disclosure. The scope of the disclosure is limited by the accompanying claims.

What is claimed is:

1. A packaging module comprising: a substrate; a chip securely mounted on and electrically connected to the substrate; a frame securely mounted on top of the substrate to enclose the chip inside a space defined by the substrate and the frame; a first Au—Sn alloy pad provided between the substrate and the frame to securely connect the frame to the substrate; a cover firmly mounted on top of the frame to sealingly encapsulate the chip inside the space; and the substrate has a first titanium layer and a patterned copper layer sequentially formed and sandwiched between the substrate and the frame, wherein the patterned copper layer is formed on two opposite sides of the substrate and electrically connected to one another.

2. The packaging module as claimed in claim 1, wherein the frame is made of a metallic material which is selected from the group containing of Al, Cu, alloy of Al, alloy of Cu, alloy of Au and alloy of Fe—Co—Ni.

3. The packaging module as claimed in claim 1, wherein the frame is made of a nonmetallic material selected from the group consisting of AlN, $Al_2O_3$, SiN and SiC.

4. The packaging module as claimed in claim 1, wherein the substrate further has a first Ni layer formed on a free side of the patterned copper layer and a first Au layer formed on a free side of the first Ni layer and the frame further has a second titanium layer and a second patterned copper layer sequentially formed on two opposite sides of the frame to correspond to and connect to the first Ni layer, the first Au layer, the first Titanium layer and the patterned copper layer.

5. The packaging module as claimed in claim 4 further comprising a third titanium layer and a third Au layer formed between the cover and the frame to sealingly encapsulate the chip inside the space.

6. The packaging module as claimed in claim 5 further comprising a second Au—Sn alloy pad sandwiched between the frame and the cover.

7. The packaging module as claimed in claim 4 further comprising a third titanium layer and a third Au layer formed between the cover and the frame to sealingly encapsulate the chip inside the space.

8. The packaging module as claimed in claim 1, wherein the cover is transparent and made of quartz.

9. A packaging module comprising: a substrate; a chip securely mounted on and electrically connected to the substrate; a frame securely mounted on top of the substrate to enclose the chip inside a space defined by the substrate and the frame; a cover firmly mounted on top of the frame to sealingly encapsulate the chip inside the space; a first Au—Sn alloy pad provided between the frame and the cover to securely connect the frame to the cover; and the substrate has a first titanium layer and a patterned copper layer sequentially formed and sandwiched between the substrate and the frame, wherein the patterned copper layer is formed on two opposite sides of the substrate and electrically connected to one another.

10. The packaging module as claimed in claim 9, wherein the frame is made of a metallic material which is selected from the group containing of Al, Cu, alloy of Al, alloy of Cu, alloy of Au and alloy of Fe—Co—Ni.

11. The packaging module as claimed in claim 9, wherein the frame is made of a nonmetallic material selected from the group consisting of AlN, $Al_2O_3$, SiN and SiC.

12. The packaging module as claimed in claim 9, wherein the substrate further has a first Ni layer formed on a free side of the patterned copper layer and a first Au layer formed on a free side of the first Ni layer and the frame further has a second titanium layer and a second patterned copper layer sequentially formed on two opposite sides of the frame to correspond to and connect to the first Ni layer, the first Au layer, the first Titanium layer and the patterned copper layer.

13. The packaging module as claimed in claim 12 further comprising a third titanium layer and a third Au layer formed between the cover and the frame to sealingly encapsulate the chip inside the space.

14. The packaging module as claimed in claim 9, wherein the cover is transparent and made of quartz.

15. The packaging module as claimed in claim 9 further comprising a second Au—Sn alloy pad sandwiched between the frame and the substrate.

16. A packaging module comprising: a substrate; a chip securely mounted on and electrically connected to the substrate; a frame securely mounted on top of the substrate to enclose the chip inside a space defined by the substrate and the frame; a cover firmly mounted on top of the frame to sealingly encapsulate the chip inside the space; a first Au—Sn alloy pad provided between the frame and the substrate to securely connect the frame to the substrate; a second Au—Sn alloy pad provided between the frame and the cover to securely connect the frame to the cover; and the substrate has a first titanium layer and a patterned copper layer sequentially formed and sandwiched between the substrate and the frame, wherein the patterned copper layer is formed on two opposite sides of the substrate and electrically connected to one another.

* * * * *